(12) United States Patent
Peng et al.

(10) Patent No.: US 9,702,957 B2
(45) Date of Patent: Jul. 11, 2017

(54) METHOD FOR CORRECTING ORIENTATION OF MAGNETOMETER

(71) Applicant: Huawei Device Co., LTD, Shenzhen (CN)

(72) Inventors: Xu Peng, Shenzhen (CN); Tian Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1024 days.

(21) Appl. No.: 13/947,886

(22) Filed: Jul. 22, 2013

(65) Prior Publication Data

US 2014/0032154 A1 Jan. 30, 2014

(30) Foreign Application Priority Data

Jul. 25, 2012 (CN) .......................... 2012 1 0259713

(51) Int. Cl.
| | | |
|---|---|---|
| *G01C 19/00* | (2013.01) | |
| *G01R 35/00* | (2006.01) | |
| *G01C 17/38* | (2006.01) | |
| *G01C 21/20* | (2006.01) | |
| *G01C 21/28* | (2006.01) | |
| *G01R 33/00* | (2006.01) | |

(52) U.S. Cl.
CPC ........... *G01R 35/005* (2013.01); *G01C 17/38* (2013.01); *G01C 21/20* (2013.01); *G01C 21/28* (2013.01); *G01R 33/0035* (2013.01)

(58) Field of Classification Search
USPC ........................................................ 702/104
See application file for complete search history.

(56) References Cited

U.S. PATENT DOCUMENTS

| | | | |
|---|---|---|---|
| 5,339,246 A | 8/1994 | Kao | |
| 5,349,530 A | 9/1994 | Odagawa | |
| 6,363,250 B1 * | 3/2002 | Lindell | G01C 17/38 |
| | | | 342/357.31 |
| 6,956,525 B1 | 10/2005 | Chang | |
| 7,340,362 B2 | 3/2008 | Kitamura et al. | |
| 2001/0029430 A1 * | 10/2001 | Tamura | G01C 21/367 |
| | | | 701/469 |

(Continued)

FOREIGN PATENT DOCUMENTS

| | | |
|---|---|---|
| CN | 1336533 A | 2/2002 |
| CN | 2476826 Y | 2/2002 |

(Continued)

OTHER PUBLICATIONS

Extended European Search Report received in Patent Application No. 13177841.7 mailed Dec. 4, 2013, 7 pages.

(Continued)

*Primary Examiner* — Paul D Lee
(74) *Attorney, Agent, or Firm* — Slater Matsil, LLP

(57) ABSTRACT

A method for correcting an orientation of a magnetometer includes obtaining current position information through a global positioning system. A geomagnetic inclination angle list is queried according to the current position information to acquire a geomagnetic inclination angle δ corresponding to a current position. A deviation Δψ of an orientation is calculated according to the geomagnetic inclination angle δ and the orientation is corrected based on the deviation Δψ of the orientation.

12 Claims, 4 Drawing Sheets

(56) References Cited

U.S. PATENT DOCUMENTS

| | | |
|---|---|---|
| 2002/0023362 A1 | 2/2002 | Kato |
| 2004/0123474 A1* | 7/2004 | Manfred ............... G01C 17/38 33/352 |
| 2006/0066295 A1* | 3/2006 | Tamura ................ G01C 17/38 324/202 |
| 2006/0217921 A1* | 9/2006 | Kourogi ............... G01C 17/38 702/150 |
| 2007/0000140 A1 | 1/2007 | Sato |
| 2008/0243417 A1 | 10/2008 | Yanni et al. |
| 2009/0212999 A1 | 8/2009 | Yoo et al. |
| 2010/0307016 A1* | 12/2010 | Mayor ................. G01C 17/38 33/356 |
| 2010/0309008 A1 | 12/2010 | Laaksonen |
| 2011/0248704 A1* | 10/2011 | Chowdhary .......... G01C 17/38 324/202 |
| 2012/0211001 A1* | 8/2012 | Elshafei ................ F24J 2/38 126/601 |

FOREIGN PATENT DOCUMENTS

| | | |
|---|---|---|
| CN | 1816730 A | 8/2006 |
| CN | 1892179 A | 1/2007 |
| CN | 101587132 A | 11/2009 |
| CN | 101868735 A | 10/2010 |
| EP | 1530024 A1 | 5/2005 |
| JP | 10160474 | 6/1998 |
| JP | 2004241907 | 8/2004 |
| JP | 2006094368 A | 4/2006 |
| JP | 2006133154 | 5/2006 |
| WO | 2009061059 A1 | 5/2009 |

OTHER PUBLICATIONS

International Search Report and Written Opinion received in application PCT/CN2013/079497 mailed Oct. 24, 2013, 10 pages.
Japanese Office Action received in Application No. 2013-154293 mailed May 20, 2014, 3 pages.

* cited by examiner

METHOD FOR CORRECTING ORIENTATION OF MAGNETOMETER

CROSS-REFERENCE TO RELATED APPLICATION

This application claims priority to Chinese Patent Application No. 201210259713.0, filed on Jul. 25, 2012, which is hereby incorporated by reference in its entirety.

TECHNICAL FIELD

The present invention relates to the field of positioning technologies, and in particular, to a method for correcting an orientation of a magnetometer and a magnetometer.

BACKGROUND

A magnetometer is capable of sensing geomagnetism, measuring a magnetic vector and determining an orientation of a device. However, a magnetometer is susceptible to the influence of the external magnet line of force including hard iron and soft iron. In this case, the trace of a magnetic vector changes, and the accuracy of data provided is affected. Then, the alignment of the hard iron and soft iron is required, but even after the alignment, the trace of the magnetic vector is not rolled back to the horizontal plane, so an inclination angle needs to be compensated.

After performing inclination angle compensation for a magnetometer, the trace of a magnet vector may be rolled back to the horizontal. An orientation $\psi$ (that is, an included angle between the magnetic north direction and a component of a magnetic vector of the magnetometer on the horizontal S which is determined by the acceleration of gravity) may be calculated by the operation between a pitch angle $\theta$ and a roll angle $\phi$ that are obtained through the calculation of a trigonometric function by using the coordinate system of an accelerometer and the coordinate system of a magnetometer. Therefore, according to the measurement precision of a pitch angel $\theta$ and a roll angle $\phi$ as well as a geomagnetic inclination angle $\delta$ (that is, an included angle between a magnetic vector and the horizontal S), it is possible to determine the deviation $\Delta\psi$ of an orientation $\psi$ so as to correct the orientation $\psi$, so that the accuracy of data provided by a magnetometer is improved.

In the method in the prior art for correcting an orientation of a magnetometer, an included angle between the magnetic vector that is measured by a magnetometer before being corrected and the horizontal S is used as $\delta$ corresponding to a current position of a device, and the $\delta$ is used to determine the deviation $\Delta\psi$ of the orientation so as to correct the orientation $\psi$.

During the process of correcting an orientation of a magnetometer, the inventor finds that the prior art has the following drawback: because the magnetometer is inaccurate before being corrected, the included angle $\delta$ between the magnetic vector that is measured by the magnetometer before being corrected and the horizontal S is also inaccurate, so using the inaccurate $\delta$ to calculate the deviation $\Delta\psi$ of the orientation and using the rough $\Delta\psi$ to correct the orientation may generate a false correction result and lead to inaccurate measurement of the magnetometer.

SUMMARY

The embodiments of the present invention provide a method for correcting an orientation of a magnetometer and a magnetometer, so that an accurate geomagnetic inclination angle $\delta$ may be acquired, so as to correct the orientation of the magnetometer accurately.

On one aspect, an embodiment of the present invention provides a method for correcting an orientation of a magnetometer, including:

obtaining current position information by the positioning through a global positioning system (Global Position System, GPS);

querying a geomagnetic inclination angle list according to the current position information to acquire a geomagnetic inclination angle $\delta$ corresponding to a current position;

calculating a deviation $\Delta\psi$ of an orientation according to the geomagnetic inclination angle $\delta$; and correcting the orientation based on the deviation $\Delta\psi$ of the orientation.

Further, before obtaining the current position information through the global positioning system, the method further includes:

obtaining the geomagnetic inclination angle list from a server, where the server updates the geomagnetic inclination angle list in real time.

Further, obtaining the current position information through the global positioning system specifically is specifically:

periodically triggering the obtaining the current position information through the global positioning system.

Furthermore, after obtaining the current position information through the global positioning system, the method further includes:

comparing the current position information with existing position information; and querying the geomagnetic inclination angle list according to the current position information, if the difference between the current position information and the existing position information exceeds a preset range.

On another aspect, an embodiment of the present invention further provides a magnetometer, including:

a positioning unit, configured to obtain current position information through a global positioning system;

a querying unit, configured to query a geomagnetic inclination angle list according to the current position information obtained by the positioning unit, to acquire a geomagnetic inclination angle $\delta$ corresponding to a current position;

a calculating unit, configured to calculate a deviation $\Delta\psi$ of an orientation according to the geomagnetic inclination angle $\delta$ acquired by the querying unit; and a correcting unit, configured to correct the orientation based on the deviation $\Delta\psi$ of the orientation calculated by the calculating unit.

Further, the positioning unit is further configured to periodically trigger the obtaining the current position information through the global positioning system.

Furthermore, the magnetometer may further include:

an obtaining unit, configured to obtain the geomagnetic inclination angle list from a server before the positioning unit obtains the current position information through the global positioning system, where the server updates the geomagnetic inclination angle list in real time; and a comparing unit, configured to compare the current position information with existing position information.

Further, the querying unit is configured to query the geomagnetic inclination angle list according to the current position information, when the comparing unit determines that the difference between the current position information and the existing position information exceeds a preset range.

With the method for correcting an orientation of a magnetometer and a magnetometer provided by the embodiments of the present invention, current position information is obtained by positioning of a GPS, a geomagnetic inclination angle list is queried to acquire a geomagnetic inclination angle δ corresponding to a current position, and an orientation is corrected based on the geomagnetic inclination angle δ corresponding to the current position. Compared with the method in the prior art for calculating a geomagnetic inclination angle δ by using a magnetic vector measured by a magnetometer that is not corrected, in the method of the present invention, the acquired geomagnetic inclination angle δ is independent of a magnetic vector measured by a magnetometer but is only dependent on the current position, so that geomagnetic inclination angles δ corresponding to different positions may be acquired accurately, thereby correcting the orientation of the magnetometer accurately.

BRIEF DESCRIPTION OF DRAWINGS

To illustrate the technical solutions in an embodiment of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from the accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Embodiment 1

Figure 1:
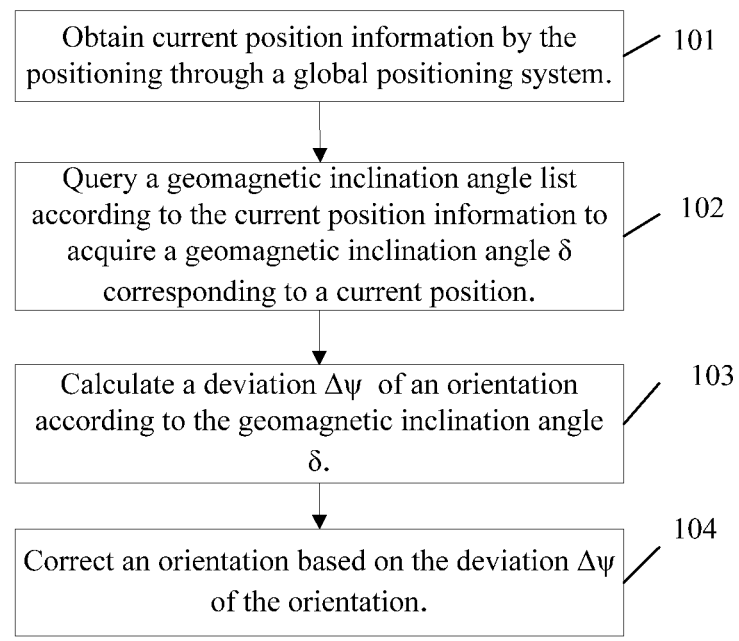
FIG. 1 is a flowchart of a method for correcting an orientation of a magnetometer according to Embodiment 1 of the present invention.

An embodiment of the present invention provides a method for correcting an orientation of a magnetometer, as shown in FIG. 1, the method includes:

Step 101: Obtain current position information by positioning through a global positioning system (Global Position System, GPS).

The global positioning system may accurately and rapidly position the majority of areas (98%) on earth all day long, and obtain current position information.

Step 102: Query a geomagnetic inclination angle list according to the current position information to acquire a geomagnetic inclination angle δ corresponding to a current position.

The geomagnetic inclination angle list may be formulated and uploaded to a server by a specified supplier. Based on simulation or experience, the supplier acquires coordinate values and geomagnetic inclination angles δ corresponding to different positions; or based on some accurate measurements and field investigations, the supplier acquires geomagnetic inclination angles δ around the whole world and formulates a list. Or, the geomagnetic inclination angle list may be preset by a user or by a manufacturer on a magnetometer, which is not restricted by the present invention.

For example, Table 1 shows an instance of a simple geomagnetic inclination angle list, where the geomagnetic inclination angle list mainly includes two items: coordinates of each position and its corresponding δ.

TABLE 1

| Geomagnetic Inclination angle List | |
|---|---|
| Position Information | Value of Geomagnetic Inclination angle δ |
| Position Coordinate 1 | δ = 0° |
| Position Coordinate 2 | δ = 30° |
| Position Coordinate 3 | δ = 45° |
| ... | ... |
| Position Coordinate n | δ = 90° |

Step 103: Calculate a deviation $\Delta\psi$ of an orientation according to the geomagnetic inclination angle δ.

In this embodiment, the method for calculating an orientation is as follows: an orientation $\psi$ may be calculated by using a pitch angle θ and a roll angle φ, where the pitch angle θ is the included angle between the horizontal and the x axis, that is, the forward and the backward directions in a coordinate system of a magnetometer; and the roll angle φ is the included angle between the horizontal and the y axis, that is, the left and the right directions in the coordinate system of the magnetometer (reference is made to the description of a pitch angle and a roll angle in an aircraft navigation system for details). The pitch angle θ and the roll angle φ may be obtained through calculation of a trigonometric function by using magnetic vector coordinates of a gravity acceleration sensor and a magnetometer. The calculation is specifically as follows:

$$\text{Roll angle } \phi: \tan\phi = \left(\frac{G_{py}}{G_{pz}}\right) \quad \text{(Formula 1)}$$

$$\text{Pitch angle } \theta: \tan\theta = \left(\frac{-G_{px}}{G_{py}\sin\phi + G_{pz}\cos\phi}\right) \quad \text{(Formula 2)}$$

where $G_{px}$ is a component of the acceleration of gravity on the x axis; $G_{py}$ is a component of the acceleration of gravity on the y axis; $G_{pz}$ is a component of the acceleration of gravity on the z axis.

According to the pitch angle θ and the roll angel φ calculated by using the formulas 1 and 2, a component of a magnetic vector can be rolled back to the horizontal, so that the orientation $\psi$ is calculated:

$$\tan\psi = \left(\frac{-B_{fy}}{B_{fx}}\right) = \left(\frac{B_{pz}\sin\phi - B_{py}\cos\phi}{B_{px}\cos\theta + B_{py}\sin\theta\sin\phi + B_{pz}\sin\theta\cos\phi}\right) \quad \text{(Formula 3)}$$

where $B_{fx}$ is a component on the x axis in a horizontal coordinate system after the component of the magnetic vector is projected on the horizontal; $B_{fy}$ is a component on the y axis in the horizontal coordinate system after the component of the magnetic vector is projected on the horizontal; $b_{px}$ is a component of the magnetic vector on the x axis; $B_{py}$ is a component of the magnetic vector on the y axis; and $B_{pz}$ is a component of the magnetic vector on the z axis.

In combination with the orientation calculation formulas 1, 2 and 3, it may be learned that the deviation of the pitch angel $\theta$ and the roll angle $\phi$ in the orientation calculation process, and the deviation of a component of a magnetic vector after hard iron and soft iron are aligned may all result in the deviation $\Delta\psi$ of the orientation. The deviation caused by the influence of the hard iron and soft iron may be corrected by an existing correction method, and therefore the present invention does not take the deviation into consideration and only focuses on the deviation brought by the calculation of the pitch angle $\theta$ and the roll angle $\phi$. The method for calculating a deviation of an orientation is:

$$\Delta\psi = \tan^{-1}\left(\frac{\sin\psi_0 + \Delta\phi\tan\delta}{\cos\psi_0 + \Delta\theta\tan\delta}\right) - \psi_0 \quad \text{(Formula 4)}$$

where $\tan^{-1}\left(\frac{\sin\psi_0 + \Delta\phi\tan\delta}{\cos\psi_0 + \Delta\theta\tan\delta}\right)$ is the measured value of an orientation measured by a magnetometer. $\psi_0$ is the theoretical value of the orientation. Based on the analysis and simplification of the orientation calculation formula 4, the maximum value of the deviation $\Delta\psi$ of the orientation is:

$$\Delta\psi_{max} \tan\delta\sqrt{\Delta\theta^2 + \Delta\phi^2} \quad \text{(Formula 5)}$$

where $\Delta\theta$ is a pitch angle deviation, and $\Delta\phi$ is a roll angle deviation.

To sum up, within a certain range of the precision requirement of the pitch angle deviation $\Delta\theta$ and the roll angle deviation $\Delta\phi$, the deviation $\Delta\psi$ of the orientation may be determined according to the geomagnetic inclination angle $\delta$. Because the precision requirement of the pitch angle deviation $\Delta\theta$ and the precision requirement of the roll angle deviation $\Delta\phi$ are determined by the requirement of a magnetometer or the precision requirement actually needed, the precision requirement of the pitch angle deviation $\Delta\theta$ and the precision requirement the roll angle deviation $\theta\phi$ are generally limited to the precision range of an existing magnetometer. For example, $\Delta\theta=\pm5°$, and $\Delta\phi=\pm5°$.

It should be noted that the above analysis process is only for obtaining a parameter influencing a deviation of an orientation. A method for calculating an orientation includes, but not limited to the preceding method, and other methods for calculating an orientation are not described in detail in the embodiment of the present invention, but factors influencing a deviation of an orientation are similar to the influencing factors described by the present invention.

Step 104: Correct the orientation based on the deviation $\Delta\psi$ of the orientation.

In the process for correcting the orientation $\psi$ of the magnetometer, the relationship between the orientation $\psi$ of the magnetometer and a orientation $\psi_0$ of a standard magnetometer of the current position is as follows: $\psi_0=\psi-\Delta\psi$. According to such function relation, the deviation $\Delta\psi$ of the orientation is either a positive or negative difference. In the southern hemisphere or the northern hemisphere, when the calculated deviation $\Delta\psi$ of the orientation is positive (that is, $\Delta\psi>0$), the orientation $\psi_0$ of the standard magnetometer of the current position may be obtained by subtracting the absolute value of the deviation $\Delta\psi$ of the orientation from the measured orientation $\psi$ of the magnetometer (that is, $\psi_0=\psi-|\Delta\psi|$), so as to complete the correction of the orientation of the magnetometer; when the calculated deviation $\Delta\psi$ of the orientation is negative (that is, $\Delta\psi<0$), the orientation $\psi_0$ of the standard magnetometer of the current position may be obtained by adding the absolute value of the deviation $\Delta\psi$ of the orientation to the measured orientation $\psi$ of the magnetometer (that is, $\psi_0=\psi+|\Delta\psi|$), so as to complete the correction of the orientation of the magnetometer. For example, when the orientation of the magnetometer $\psi=10°$, if the deviation of the orientation $\Delta\psi=+4°$, the orientation of the standard magnetometer $\psi_0=10-4=6°$; if the deviation of the orientation $\Delta\psi=-4°$, the orientation of the standard magnetometer $\psi_0=10+4=14°$.

With the method for correcting an orientation of a magnetometer provided by the embodiment of the present invention, current position information is obtained by the positioning through a GPS, a geomagnetic inclination angle list is queried to acquire a geomagnetic inclination angle $\delta$ corresponding to a current position, and an orientation is corrected based on the geomagnetic inclination angle $\delta$ corresponding to the current position. Compared with the method in the prior art for calculating a geomagnetic inclination angle $\delta$ by using a magnetic vector measured by a magnetometer that is not corrected, in the method of the present invention, the acquired geomagnetic inclination angle $\delta$ is independent of a magnetic vector measured by a magnetometer but is only dependent on the current position, so that geomagnetic inclination angles $\delta$ corresponding to different positions may be acquired accurately, thereby correcting the orientation of the magnetometer accurately.

Embodiment 2

Figure 2:
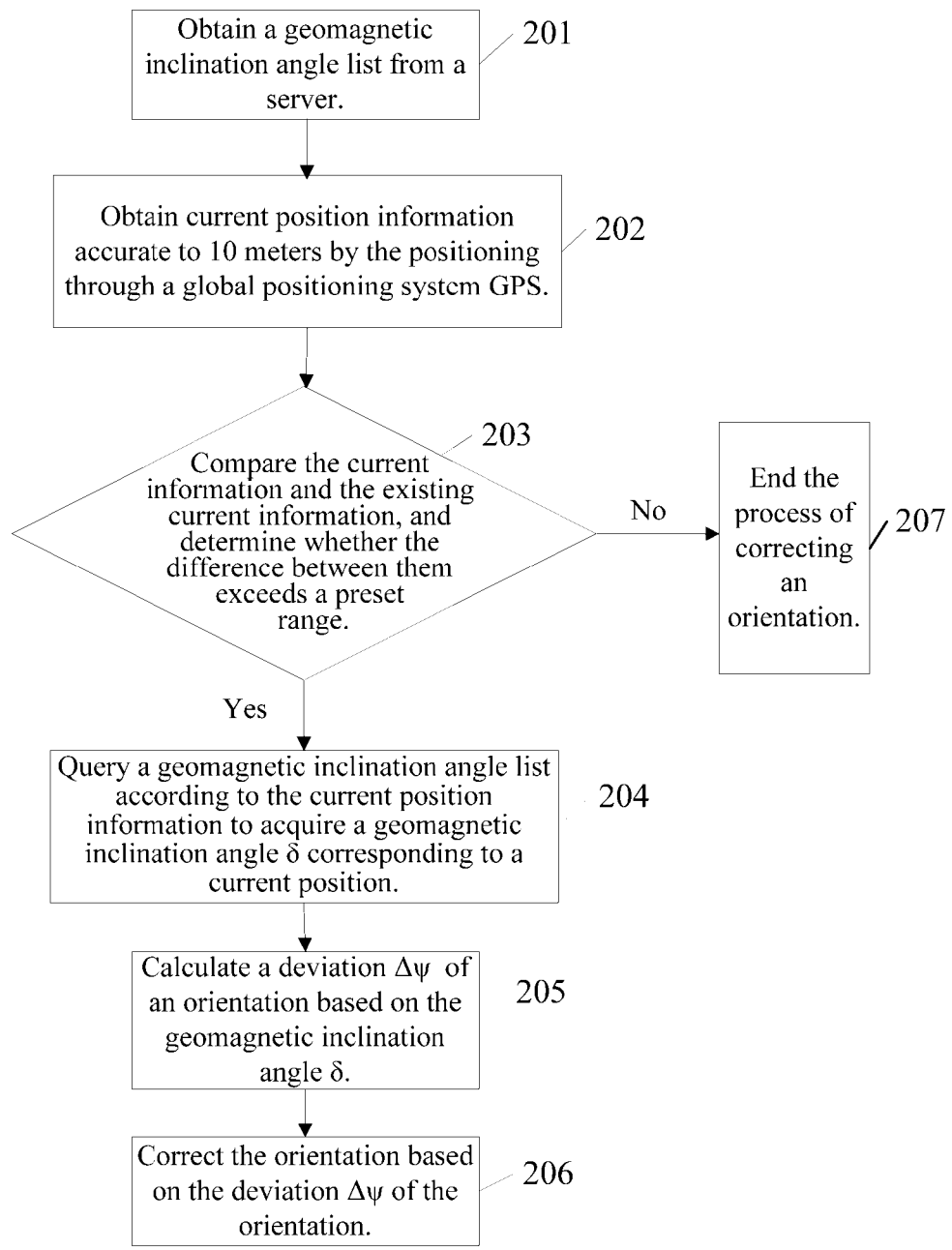
FIG. 2 is a flowchart of a method for correcting an orientation of a magnetometer according to Embodiment 2 of the present invention.

An embodiment of the present invention provides a method for correcting an orientation of a magnetometer, as shown in FIG. 2, the method includes:

Step 201: Obtain a geomagnetic inclination angle list from a server.

The server may update the geomagnetic inclination angle list in real time. Because the geomagnetic field constantly changes and even geomagnetic reversal may occur, a geomagnetic inclination angle varies not only with position but also with time. Or, geomagnetic inclination angles in some areas that are not included in a geomagnetic inclination angle list may also be measured and added to the geomagnetic inclination angle list. Therefore, a supplier may continuously perform accurate measurement and update the values of the geomagnetic inclination angles, so as to perfect the geomagnetic inclination angle list to facilitate querying.

In this embodiment, step 201 is optional. This step may be skipped in the embodiment and a geomagnetic inclination angle list pre-saved locally on a magnetometer is adopted.

For example, at a specified geographical position and during a specified time period, when a magnetometer is corrected, the geomagnetic inclination angle $\delta$ corresponding to the current position in an original geomagnetic inclination angle list is used to correct an orientation because a geomagnetic inclination angle of each position seldom changes, which not only has no impact on the effect of the correction, but also simplifies the steps of the correction. For example, assuming that the orientation of the magnetometer was corrected in Beijing in March last year, the trace of a magnetic vector changes and the accuracy of date provided by the magnetometer decreases, because the magnetic vector is interfered by external magnetic materials in the process of using the magnetometer. Therefore, the orientation of the magnetometer needs to be corrected again currently. When the orientation of the magnetometer is corrected, because the geomagnetic inclination angle δ does not change in a short period at the same position, it is unnecessary to obtain the geomagnetic inclination angle δ corresponding to the current position by querying the geomagnetic inclination angle list according to current position information. Instead, δ that is locally pre-saved on the magnetometer is used to determine the deviation Δψ of the orientation, so as to correct the orientation of the magnetometer.

Step 202: Obtain current position information through the global positioning system.

The positioning precision of the global positioning system is capable of making the current position accurate to within 10 meters. With enhancement of a positioning capacity, the precision of position information obtained by positioning may be further improved.

In an application scenario of this embodiment, obtaining the current position information through the global positioning system may be triggered by a user. To improve the accuracy and the real-time property of the geomagnetic inclination angle, obtaining the current position information through the global positioning system may be periodically triggered in another application scenario of this embodiment.

Specifically, when a user location changes, the geomagnetic inclination angle may change correspondingly. For example, within the precision range Δθ=±5° and Δϕ=±5° of a pitch angle and a roll angle that can be achieved currently, geomagnetic inclination angles and orientation deviations in different positions are as follows:

In the equator, δ=0°, and tan δ=0, orientation deviation Δψ=0°;

In Shenzhen, δ=30°, and tan δ=0.577, orientation deviation Δψ=4°;

In Shanghai, δ=45°, and tan δ=1, orientation deviation Δψ=7°;

In Heilongjiang, δ=70°, and tan δ=2.75, orientation deviation Δψ=19°;

In the south pole and the north pole, δ=90°, and tan δ=∞, orientation deviation Δψ=∞°;

It can be seen that, when Δθ and Δϕ are specified, geomagnetic inclination angles δ corresponding to different geographical positions are different, which may bring great change in orientation deviations Δψ. The specific process for calculating a deviation Δψ of an orientation according to the geomagnetic inclination angle δ is as follows: calculating the trigonometric tangent value (tan δ) of the geomagnetic inclination angle δ, and then calculating the deviation Δψ of the orientation through formula 5 ($\Delta\psi_{max}=\tan\delta\sqrt{\Delta\theta^2+\Delta\phi^2}$) by using the tangent value of the geomagnetic inclination angle δ and the deviations of the pitch angle and the roll angle.

For example, based on the analysis of the listed data: after the current position is changed from Shenzhen to Shanghai, the geomagnetic inclination angle δ is increased from 35° to 45°, and a deviation of an orientation is increased by 3°; and after the current position is changed from Shenzhen to Heilongjiang, the geomagnetic inclination angle δ is increased from 30° to 70°, and a deviation of an orientation is increased by 15°. Therefore, triggering, by the user, the obtaining the current position information through the global positioning system and even periodically triggering the obtaining the current position information through the global positioning system may improve the accuracy and the real-time property of the obtained current position information, thereby improving the accuracy of correction of the orientation.

In a practical application, a magnetometer is mainly applied in the middle latitudes and the low latitudes where more people inhabit in. Based on the analysis of the listed data, a δ may decrease gradually while getting closer to the middle latitudes or the low latitudes, and a deviation Δψ of an orientation is smaller. As approaching to the equator, a δ approximates to 0° and a deviation Δψ of an orientation approximates to 0°. Therefore, when the magnetometer is corrected according to this embodiment in the middle latitudes or the low latitudes even in areas near equatorial, the remarkable effect for magnetometer correction may be achieved.

Step 203: Compare the current position information with existing position information; if the difference between the current position information and the existing position information exceeds a preset range, perform step 204; if the difference between the current position information and the existing position information does not exceed the preset range, perform step 207.

The preset range is set within the minimum area covered by the same geomagnetic inclination angle δ in the geomagnetic inclination angle list provided by the server. For example, assuming that the difference between the position information of A and the position information of B is in a preset range, and that the difference between the position information of A and the position information of C exceeds the preset range, after a user moves from A to B and before the current position information is obtained by the positioning through the GPS, the position information of A and the position information of B are first compared and whether the difference between the position information of A and the position information of B exceeds a preset range is determined, and then a result is obtained: the difference between the position information of A and the position information of B does not exceed the preset range, because geomagnetic inclination angles δ corresponding to all positions within the preset range are the same, it is unnecessary to correct an orientation again. Similarly, after a user moves from A to C, the position information of A and the position information of C are compared, and whether the difference between the position information of A and the position information of C exceeds a preset range is determined, and then a result is obtained: the difference between the position information of A and the position information of C exceeds the preset range, and then obtaining the position information of C by the positioning through the GPS and correcting an orientation are performed again.

It should be noted that step 203 is optional, and comparing the current position information and the existing position information may reduce unnecessary positioning and calculation, thereby simplifying the steps of correcting the orientation of the magnetometer. In this embodiment, step 203 may be skipped, and step 204 and the subsequent procedure may be directly performed after the obtaining the current position information by positioning.

Step 204: Query a geomagnetic inclination angle list according to the current position information to acquire a geomagnetic inclination angle δ corresponding to a current position.

Step 205: Calculate a deviation Δψ of an orientation according to the geomagnetic inclination angle δ.

Step 206: Correct the orientation based on the deviation Δψ of the orientation.

Step 207: End the process of correcting an orientation.

With the method for correcting an orientation of a magnetometer provided by the embodiment of the present invention, current position information is obtained by the positioning through a GPS, a geomagnetic inclination angle list is queried to acquire a geomagnetic inclination angle δ corresponding to a current position, and an orientation is corrected based on the geomagnetic inclination angle δ corresponding to the current position. Compared with the method in the prior art for calculating a geomagnetic inclination angle δ by using a magnetic vector measured by a magnetometer that is not corrected, in the method of the present invention, the acquired geomagnetic inclination angle δ is independent of a magnetic vector measured by a magnetometer but is only dependent on the current position, so that geomagnetic inclination angles δ corresponding to different positions may be acquired accurately, thereby correcting the orientation of the magnetometer accurately.

In addition, the querying a geomagnetic inclination angle list according to the current position information is performed before the querying current information, a geomagnetic inclination angle list updated in real time is obtained from a server, and the obtaining the current position information through the global positioning system is periodically triggered, so that the querying in the present invention has better real-time property and accuracy as compared with the prior art. Further, the current position information obtained by the querying and the existing position information are compared, when the difference between the current position information and the existing position information does not exceed the preset range, orientation correction ends, so that the amount of calculation for correcting the orientation of the magnetometer is reduced.

Embodiment 3

Figure 3:
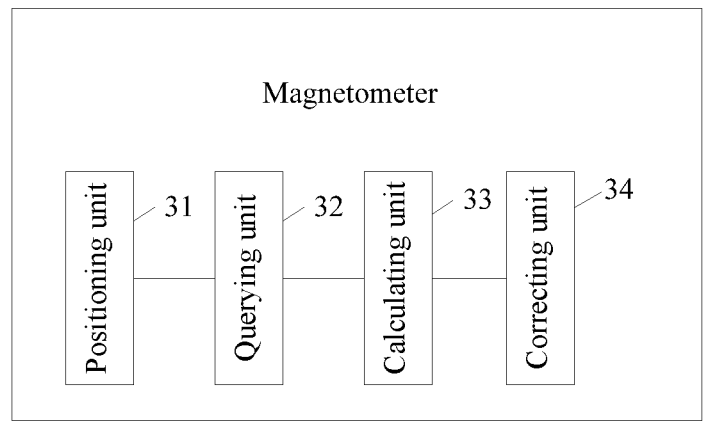
FIG. 3 is a component schematic diagram of a magnetometer according to Embodiment 3 of the present invention.

An embodiment of the present invention provides a magnetometer, as shown in FIG. 3, including: a positioning unit 31, a querying unit 32, a calculating unit 33 and a correcting unit 34.

The positioning unit 31 is configured to obtain current position information through a global positioning system;

The querying unit 32 is configured to query a geomagnetic inclination angle list according to the current position information obtained by the positioning unit 31, to acquire a geomagnetic inclination angle δ corresponding to a current position;

The calculating unit 33 is configured to calculate a deviation Δψ of an orientation according to the geomagnetic inclination angle δ acquired by the querying unit 32; and The correcting unit 34 is configured to correct the orientation based on the deviation Δψ of the orientation calculated by the calculating unit 33.

Further, the current position information is accurate to within 10 meters.

Further, the positioning unit 31 is further configured to periodically trigger the obtaining current position information through the global positioning system.

Figure 4:
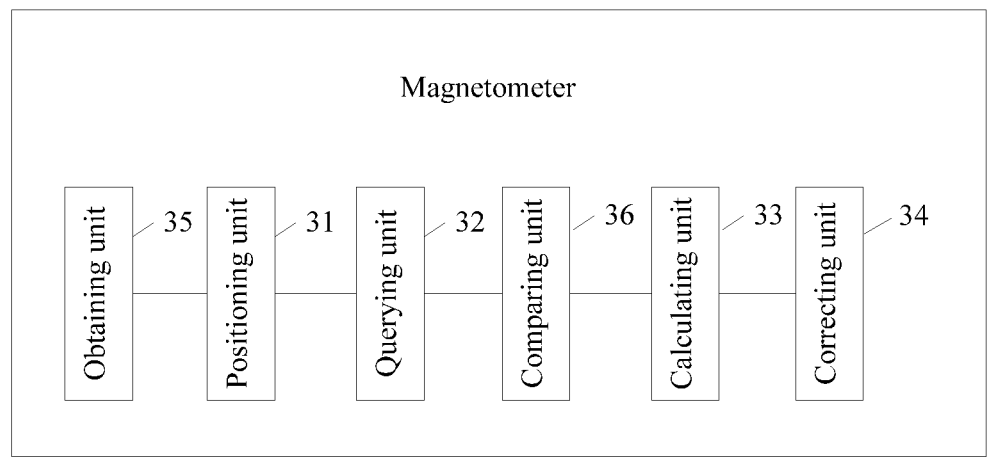
FIG. 4 is a component schematic diagram of another magnetometer according to Embodiment 3 of the present invention.

As shown in FIG. 4, the magnetometer may further include an obtaining unit 35 and a comparing unit 36.

The obtaining unit 35 is configured to obtain the geomagnetic inclination angle list from a server before the positioning unit 31 obtains the current position information through the global positioning system, where the server updates the geomagnetic inclination angle list in real time.

The comparing unit 36 is configured to compare the current position information with existing position information.

Further, the querying unit 32 is further configured to query the geomagnetic inclination angle list according to the current position information, when the comparing unit 36 determines that the difference between the current position information and the existing position information exceeds a preset range.

An embodiment of the present invention further provides a terminal, where the terminal includes a magnetometer. For the detailed description of the magnetometer, reference may be made to the corresponding content in Embodiments 1 to 3 of the present invention, and details are not repeated in the embodiment of the present invention again.

With the magnetometer and the terminal provided by the embodiment of the present invention, current position information is obtained by the positioning through a GPS, a geomagnetic inclination angle list is queried to acquire a geomagnetic inclination angle δ corresponding to a current position, and an orientation is corrected based on the geomagnetic inclination angle δ corresponding to the current position. Compared with the method in the prior art for calculating a geomagnetic inclination angle δ by using a magnetic vector measured by a magnetometer that is not corrected, in the method of the present invention, the acquired geomagnetic inclination angle δ is independent of a magnetic vector measured by a magnetometer but is only dependent on the current position, so that geomagnetic inclination angles δ corresponding to different positions may be acquired accurately, thereby correcting the orientation of the magnetometer accurately.

Embodiment 4

Figure 5:
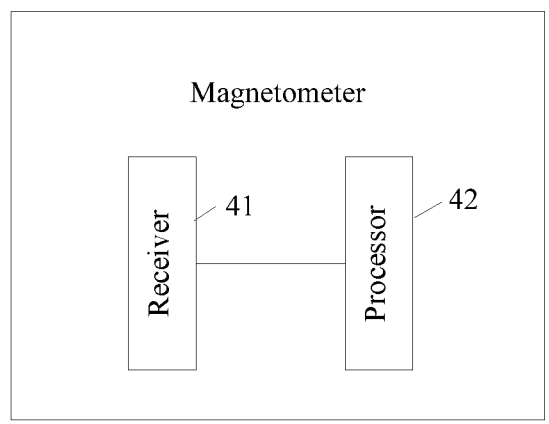
FIG. 5 is a component schematic diagram of a magnetometer according to Embodiment 4 of the present invention.

An embodiment of the present invention provides a magnetometer, as shown in FIG. 5, including: a receiver 41 and a processor 42.

The receiver 41 is configured to obtain current position information through a global positioning system; and The processor 42 is configured to query a geomagnetic inclination angle list according the current position information to acquire a geomagnetic inclination angle δ corresponding to a current position; calculate a deviation Δψ of an orientation according to the geomagnetic inclination angle δ; and correct the orientation based on the deviation Δψ of the orientation.

Further, the receiver 42 is further configured to obtain the geomagnetic inclination angle list from a server, where the server updates the geomagnetic inclination angle list in real time.

Further, the current position information is accurate to within 10 meters.

Further, the processor 42 is further configured to periodically trigger the obtaining the current position information through the global positioning system.

Further, the processor 42 is further configured to compare the current position information and existing position information; if the difference between the current position information and the existing position information exceeds a preset range, query the geomagnetic inclination angle list according to the current position information; if the difference between the current position information and the existing position information does not exceed the preset range, end the process of correcting an orientation.

With the magnetometer provided by the embodiment of the present invention, current position information is obtained by the positioning through a GPS, a geomagnetic inclination angle list is queried to acquire a geomagnetic inclination angle δ corresponding to a current position, and an orientation is corrected based on the geomagnetic inclination angle δ corresponding to the current position. Compared with the method in the prior art for calculating a geomagnetic inclination angle δ by using a magnetic vector measured by a magnetometer that is not corrected, in the method of the present invention, the acquired geomagnetic inclination angle δ is independent of a magnetic vector measured by a magnetometer but is only dependent on the current position, so that geomagnetic inclination angles δ corresponding to different positions may be acquired accurately, thereby correcting the orientation of the magnetometer accurately.

Through the foregoing description of the embodiments, it is clear to persons skilled in the art that the present invention may be implemented by software plus necessary universal hardware, and of course, may also be implemented by hardware, but in many cases, the software implementation is preferred. Based on such understanding, the technical solutions of the present invention essentially, or the part contributing to the prior art may be implemented in the form of a software product. The computer software product is stored in a readable storage medium, for example, a floppy disk, hard disk, or optical disk of the computer, and includes several instructions for instructing a computer device (which may be a personal computer, a server, a network device, or the like) to perform the methods described in the embodiments of the present invention.

The foregoing description is merely about specific embodiments of the present invention, but is not intended to limit the protection scope of the present invention. Any variation or replacement readily figured out by persons skilled in the art within the technical scope of the present invention shall fall within the protection scope of the present invention. Therefore, the protection scope of the present invention shall be subject to the protection scope of the claims.

What is claimed is:

1. A method, comprising:
measuring an orientation of a device by a magnetometer, the orientation being an angle between the magnetic north direction and a component of a magnetic vector measured by the magnetometer, wherein the component of the magnetic vector is on a horizontal surface determined by acceleration of gravity;
determining, by the magnetometer, a current position of the device through a global positioning system, wherein current position information corresponding to the current position is obtained by the magnetometer;
querying, by the magnetometer, a geomagnetic inclination angle list according to the current position information to acquire a geomagnetic inclination angle corresponding to the current position;
calculating, by the magnetometer, a deviation of the measured orientation according to the geomagnetic inclination angle;
correcting the measured orientation based on the calculated deviation of the measured orientation; and
providing a corrected orientation of the device according to the corrected measured orientation.

2. The method according to claim 1, further comprising:
obtaining the geomagnetic inclination angle list from a server before determining the current position of the device, wherein the server updates the geomagnetic inclination angle list in real time.

3. The method according to claim 1, wherein determining the current position of the device through the global positioning system comprises periodically determining the current position of the device through the global positioning system upon a trigger.

4. The method according to claim 1, further comprising:
determining whether the measured orientation of the device needs to be corrected by comparing the current position information with existing position information corresponding to a previous position of the device;
wherein the measured orientation is corrected based on a calculated deviation of the measured orientation when a difference between the current position information and the existing position information exceeds a preset range; and
wherein the measured orientation is not corrected when the difference between the current position information and the existing position information does not exceed the preset range.

5. A magnetometer, comprising:
a processor; and
a non-transitory computer readable storage medium storing programming for execution by the processor, wherein the programming includes instructions to:
measure an orientation of a device, the orientation being an angle between the magnetic north direction and a component of a magnetic vector of the magnetometer, wherein the component of the magnetic vector is on a horizontal surface determined by acceleration of gravity;
determine a current position of the device through a global positioning system, wherein current position information corresponding to the current position is obtained by the magnetometer;
query a geomagnetic inclination angle list according to the current position information to acquire a geomagnetic inclination angle corresponding to the current position;
calculate a deviation of the measured orientation according to the geomagnetic inclination angle;
adjust the measured orientation based on the calculated deviation of the measured orientation; and
provide an adjusted orientation of the device according to the adjusted measured orientation.

6. The magnetometer according to claim 5, wherein the programming comprises further instructions to obtain the geomagnetic inclination angle list from a server before determining the current position of the device, wherein the server updates the geomagnetic inclination angle list in real time.

7. The magnetometer according to claim 5, wherein current position of the device is determined periodically upon a trigger.

8. The magnetometer according to claim 5, wherein the programming comprises further instructions to determine whether the measured orientation of the device needs to be corrected by comparing the current position information with existing position information corresponding to a previous position of the device, wherein the measured orientation is corrected based on the calculated deviation of the measured orientation when a difference between the current position information and the existing position information exceeds a preset range, and the measured orientation is not corrected when the difference between the current position information and the existing position information does not exceed the preset range.

9. A terminal, comprising a magnetometer, wherein the magnetometer comprises:

a processor; and a non-transitory computer readable storage medium storing programming for execution by the processor, wherein the programming includes instructions to:

measure an orientation of the terminal, the orientation being an angle between the magnetic north direction and a component of a magnetic vector of the magnetometer, wherein the component of the magnetic vector is on a horizontal surface determined by acceleration of gravity;

determine a current position of the terminal through a global positioning system, wherein current position information of the current position is obtained by the magnetometer;

query a geomagnetic inclination angle list according to the current position information to acquire a geomagnetic inclination angle corresponding to the current position;

calculate a deviation of the measured orientation according to the geomagnetic inclination angle; and adjust the measured orientation based on the calculated deviation of the measured orientation; and provide an adjusted orientation of the terminal according to the adjusted measured orientation.

10. The terminal according to claim 9, wherein the programming comprises further instructions to obtain the geomagnetic inclination angle list from a server before determining the current position of the terminal, wherein the server updates the geomagnetic inclination angle list in real time.

11. The terminal according to claim 9, wherein the current position of the terminal is determined periodically upon a trigger.

12. The terminal according to claim 9, wherein the programming comprises further instructions to determine whether the measured orientation of the terminal needs to be corrected by comparing the current position information with existing position information corresponding to a previous position of the terminal, wherein the measured orientation is corrected based on the calculated deviation of the measured orientation when a difference between the current position information and the existing position information exceeds a preset range, and the measured orientation is not corrected when the difference between the current position information and the existing position information does not exceed the preset range.

* * * * *

UNITED STATES PATENT AND TRADEMARK OFFICE
CERTIFICATE OF CORRECTION

PATENT NO. : 9,702,957 B2  
APPLICATION NO. : 13/947886  
DATED : July 11, 2017  
INVENTOR(S) : Xu Peng et al.

Page 1 of 1

It is certified that error appears in the above-identified patent and that said Letters Patent is hereby corrected as shown below:

On the Title Page

Item (73) Assignee, Line 1, Please delete "Huawei Technologies Co., Ltd.," and insert --Huawei Device Co., Ltd.--.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*